US006600760B1

(12) United States Patent
Green et al.

(10) Patent No.: US 6,600,760 B1
(45) Date of Patent: Jul. 29, 2003

(54) METHOD AND APPARATUS FOR TUNING A LASER

(75) Inventors: Evan D. H. Green, San Jose, CA (US); William B. Chapman, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 43 days.

(21) Appl. No.: 09/626,537

(22) Filed: Jul. 27, 2000

Related U.S. Application Data

(60) Provisional application No. 60/145,831, filed on Jul. 27, 1999.

(51) Int. Cl.[7] ................................................ H01S 3/10
(52) U.S. Cl. ................................................ 372/20
(58) Field of Search ........................ 372/20, 98, 99, 372/102, 105

(56) References Cited

U.S. PATENT DOCUMENTS

| | | | |
|---|---|---|---|
| 3,676,799 A | * 7/1972 | Danielmeyer | 331/94.5 |
| 4,504,950 A | 3/1985 | AuYoung | |
| 5,225,930 A | 7/1993 | Land et al. | |
| 5,606,439 A | 2/1997 | Wu | |
| 5,949,801 A | * 9/1999 | Tayebati | 372/20 |
| 6,021,141 A | * 2/2000 | Nam et al. | 372/20 |
| 6,028,881 A | * 2/2000 | Ackerman et al. | 372/75 |
| 6,108,355 A | 8/2000 | Zorabedian | |
| 6,137,821 A | * 10/2000 | Ershov | 372/108 |
| 6,205,159 B1 | 3/2001 | Sesko et al. | 372/20 |
| 6,233,263 B1 | * 5/2001 | Chang-Hasnain et al. | 372/32 |
| 6,256,328 B1 | * 7/2001 | Delfyett et al. | 372/23 |
| 6,289,032 B1 | * 9/2001 | Fay et al. | 372/102 |
| 6,295,306 B1 | * 9/2001 | Asami | 372/20 |

* cited by examiner

Primary Examiner—Quyen Leung
Assistant Examiner—Davienne Monbleau
(74) Attorney, Agent, or Firm—Blakely, Sokoloff, Taylor & Zafman LLP

(57) ABSTRACT

The present invention provides a continuously tunable external cavity laser (ECL) with a compact form factor and precise tuning to a selected center wavelength of a selected wavelength grid. The ECL may thus be utilized in telecom applications to generate the center wavelengths for any channel on the ITU or other optical grid. The ECL does not require a closed loop feedback. A novel tuning mechanism is disclosed which provides for electrical or mechanical tuning to a known position or electrical parameter, e.g., voltage, current or capacitance, with the required precision in the selected center wavelength arising as a result of a novel arrangement of a grid generator and a channel selector. The grid generator exhibits first pass bands which correspond to the spacing between individual channels of the selected wavelength grid and a finesse which suppresses side band modes of the laser. The channel selector exhibits second pass bands differing from the first transmission bands by an amount corresponding substantially inversely with the number of channels of the selected wavelength grid. This relationship allows "vernier" tuning of the output wavelength of the laser to a selected wavelength on the wavelength grid. The finesse of the grid generator and channel selector is chosen to suppress channels adjacent to the selected channel. In an alternate embodiment of the invention a gain medium operable as a grid generator is disclosed. In an alternate embodiment of the invention a method for tuning a laser is disclosed.

39 Claims, 7 Drawing Sheets

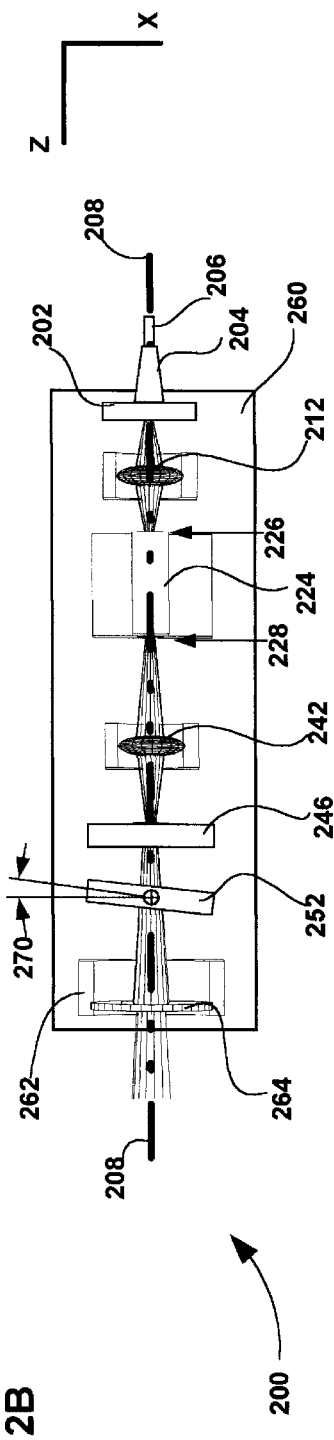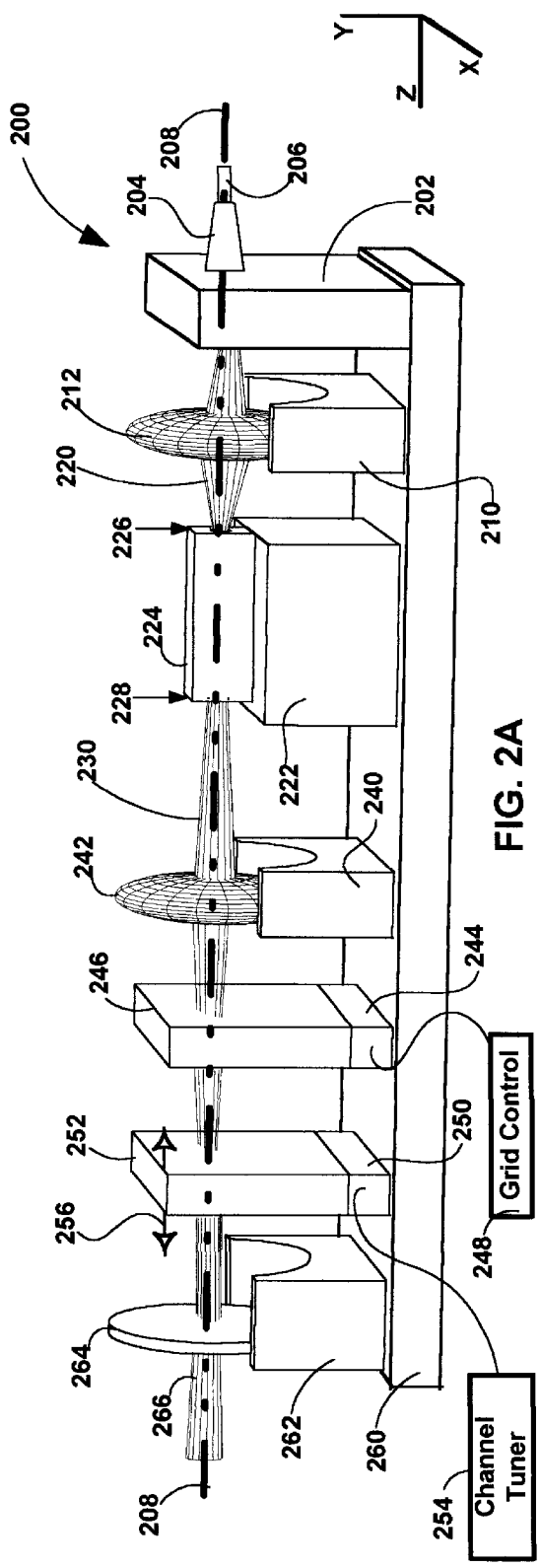

METHOD AND APPARATUS FOR TUNING A LASER

CROSS REFERENCE TO RELATED APPLICATIONS

This application claims the benefit of prior filed U.S. Provisional Application No. 60/145,831 filed on Jul. 27, 1999 entitled "VERNIER TUNED ECDL" by inventor Evan D. H. Green which is incorporated herein by reference in its entirety.

BACKGROUND OF THE INVENTION

1. Field of Invention

The invention pertains to wavelength-agile laser transmitters for wavelength-division-multiplexed (WDM) optical communications networks. More particularly, the invention pertains to laser transmitters with internal wavelength referencing that can be remotely switched to arbitrarily selectable channels on a standard grid, and to re-configurable optical communications networks.

2. Description of the Related Art

The telecommunications network serving the United States and the rest of the world is presently evolving from analog to digital transmission with ever increasing bandwidth requirements. Fiber optic cable has proved to be a valuable tool, replacing copper cable in nearly every application from large trunks to subscriber distribution plants. Fiber optic cable is capable of carrying much more information than copper with lower attenuation.

The T-1 standards committee ANSI has provided a draft document, "ANSI T1.105-1988", dated Mar. 10, 1988, which sets forth specifications for rate and format of signals which are to be used in optical interfaces. The provided specifications detail the Synchronous Optical Network (SONET) standard. SONET defines a hierarchy of multiplexing levels and standard protocols which allow efficient use of the wide bandwidth of fiber optic cable, while providing a means to merge lower level time division multiplexed public switched telephone network (PSTN) signals into a common medium. In essence, SONET established a uniform standardization transmission and signaling scheme, which provided a synchronous transmission format that is compatible with all current and anticipated signal hierarchies. Because of the nature of fiber optics, expansion of bandwidth is easily accomplished.

Currently this expansion of bandwidth is being accomplished by what is known as "wavelength division multiplexing" (WDM), in which separate subscriber/data sessions may be handled concurrently on a single optic fiber by means of modulation of each of those subscriber datastreams on different portions of the light spectrum. Therefore, WDM is the optical equivalent of frequency division multiplexing (FDM). Current International Telecommunications Union (ITU) specifications call for channel separations of approximately 0.4 nm, i.e., 50 GigaHertz. At this separation, as many as 128 channels may be carried by a single fiber in a bandwidth range within the same capacity of an erbium doped fiber amplifier (EDFA). Each subscriber datastream is optically modulated onto the output beam of a corresponding semiconductor laser. The modulated information from each of the semiconductor lasers is combined onto a single optic fiber for transmission.

The lasers presently deployed are distributed-feedback (DFB) diode lasers. The wavelength grid is defined by the transmission peaks of a Fabry-Perot reference etalon. The technology for fabricating these etalons from glass or fused silica in large quantities at reasonable cost is well developed. Present transmitters use a combination of a DFB laser and a reference etalon in a feedback control loop. DFB lasers suffer from the drawback that they have small tuning ranges of ~3 nm (See, e.g., J. Carroll, J. Whiteaway, & D. Plumb, *Distributed feedback semiconductor lasers*, SPIE Press, 1998). A DFB laser's characteristics can only be approximately determined by design. In practice the center wavelengths are distributed across the grid span due to statistical variations in the manufacturing process. Thus each DFB laser transmitter must be individually sorted and is usable for only one channel or a small number of adjacent channels. As a result, DFB laser transmitters cannot be assigned to arbitrary channels.

On the other hand, WDM networks are evolving towards re-configurable architectures in which each transmitter's wavelength must be re-selectable by remote command. Re-configurable networks offer significant capacity, reliability, and management advantages over static systems (See, e.g., R. Ramaswami and K. Sivarajan, *Optical Networks, A Practical Perspective*, Morgan Kaufmann Publishers, 1998).

Thus there exists a need for laser transmitters that can be arbitrarily switched to desired channel wavelengths within the wavelength grid of a WDM network.

SUMMARY OF THE INVENTION

The present invention provides a tunable external cavity laser (ECL) with a compact form factor and precise tuning to any selected wavelength of a predetermined set of wavelengths comprising a wavelength grid. The ECL may thus be utilized in telecom applications to generate the center wavelengths for any channel on the ITU or other optical grid. The ECL does not require closed loop feedback to maintain wavelength accuracy. A novel tuning mechanism is disclosed which provides for electrical or mechanical tuning to a known position or electrical parameter, e.g., voltage, current, capacitance, with the required precision in the selected center wavelength arising as a result of a novel arrangement of a grid generator and a channel selector. The grid generator exhibits first pass bands which correspond to the individual channels of a selected wavelength grid and a finesse which suppresses cavity side modes of the laser. The channel selector exhibits second pass bands differing from the first transmission bands by an amount corresponding substantially inversely with the number of channels of the selected wavelength grid. This relationship allows "vernier" tuning of the output wavelength of the laser to a selected wavelength on the wavelength grid. The finesse of the grid generator and channel selector is chosen to suppress channels adjacent to the selected channel.

In an embodiment of the invention a tunable external cavity laser tunable to each selected center wavelength of a number of channels each centered on a corresponding gridline of a selected wavelength grid is disclosed. The tunable external cavity laser includes a gain medium, a grid generator and a channel selector. The gain medium to emit a beam. The grid generator is located in an optical path of the beam, and the grid generator of a first selected optical path length determinative of a first free spectral range substantially corresponding to a spacing between adjacent gridlines of the selected wavelength grid. The channel selector is located in the optical path of the beam and the channel selector with a tunable second selected optical path length determinative of a second free spectral range differing from the first free spectral range by an amount corresponding substantially inversely with the number of channels of the selected wavelength grid and said channel selector tunable within the selected wavelength grid to tune the beam to a selected one of the number of channels of the wavelength grid.

In an alternate embodiment of the invention the tunable external cavity laser includes the gain medium, a first filter and a tunable filter. The gain medium to emit a beam. The first filter is located in an optical path of the beam The first filter exhibits first pass bands substantially corresponding to the channels of the selected wavelength grid. The tunable filter is located in the optical path of the beam. The tunable filter exhibits second pass bands differing from the first pass bands by an amount corresponding substantially inversely with the number of channels of the selected wavelength grid. The tunable filter is tunable within the selected wavelength grid to tune the beam to a selected one of the number of channels of the wavelength grid.

In an alternate embodiment of the invention a gain medium operable as a grid generator is disclosed.

In an alternate embodiment of the invention a method for tuning a beam emitted by a gain medium to a corresponding center wavelength for each of a plurality of channels of a selected wavelength grid is disclosed. The method for tuning comprising the acts of:

filtering the beam to provide feedback to the gain medium of a first set of wavelengths substantially corresponding with the center wavelengths for each of the number of channels;

tuning the beam to provide feedback to the gain medium of a selected one of a second set of wavelengths with a periodicity differing from the periodicity of the first set of wavelengths by an amount corresponding substantially inversely with the number of channels of the selected wavelength grid.

BRIEF DESCRIPTION OF THE DRAWINGS

These and other features and advantages of the present invention will become more apparent to those skilled in the art from the following detailed description in conjunction with the appended drawings in which:

FIG. 1 shows an embodiment of the invention in which an optical network is coupled to a plurality of data and voice subscriber lines by an optical multiplexer (mux) and demultiplexer (demux) utilizing external cavity lasers tunable to the center frequency of any of the wavelength division multiplexed channels on the optical network.

FIGS. 2A–B are isometric and top views respectively of a tunable external cavity laser according to the current invention.

DETAILED DESCRIPTION OF THE EMBODIMENTS

The present invention provides a tunable external cavity laser (ECL) with a compact form factor and precise tuning to any selected center wavelength of a selected wavelength grid. The ECL may thus be utilized in telecom applications to generate the center wavelength for any channel on the ITU or other optical grid. The ECL does not require a closed loop feedback. A novel tuning mechanism is disclosed which provides for electrical or mechanical tuning to a known position or electrical parameter, e.g., voltage, current, capacitance, with the required precision in the selected center wavelength arising as a result of a novel arrangement of a grid generator and a channel selector. The grid generator exhibits first pass bands which correspond to the individual channels of the selected wavelength grid and a finesse which suppresses side modes of the laser. The channel selector exhibits second pass bands differing from the first transmission bands by an amount corresponding substantially inversely with the number of channels of the selected wavelength grid. This relationship allows "vernier" tuning of the output wavelength of the laser to a selected wavelength on the wavelength grid. The finesses of the grid generator and channel selector are chosen to suppress lasing on channels adjacent to the selected channel. The tuning mechanism does not require a closed loop feedback system to control the channel selector.

Figure 1:
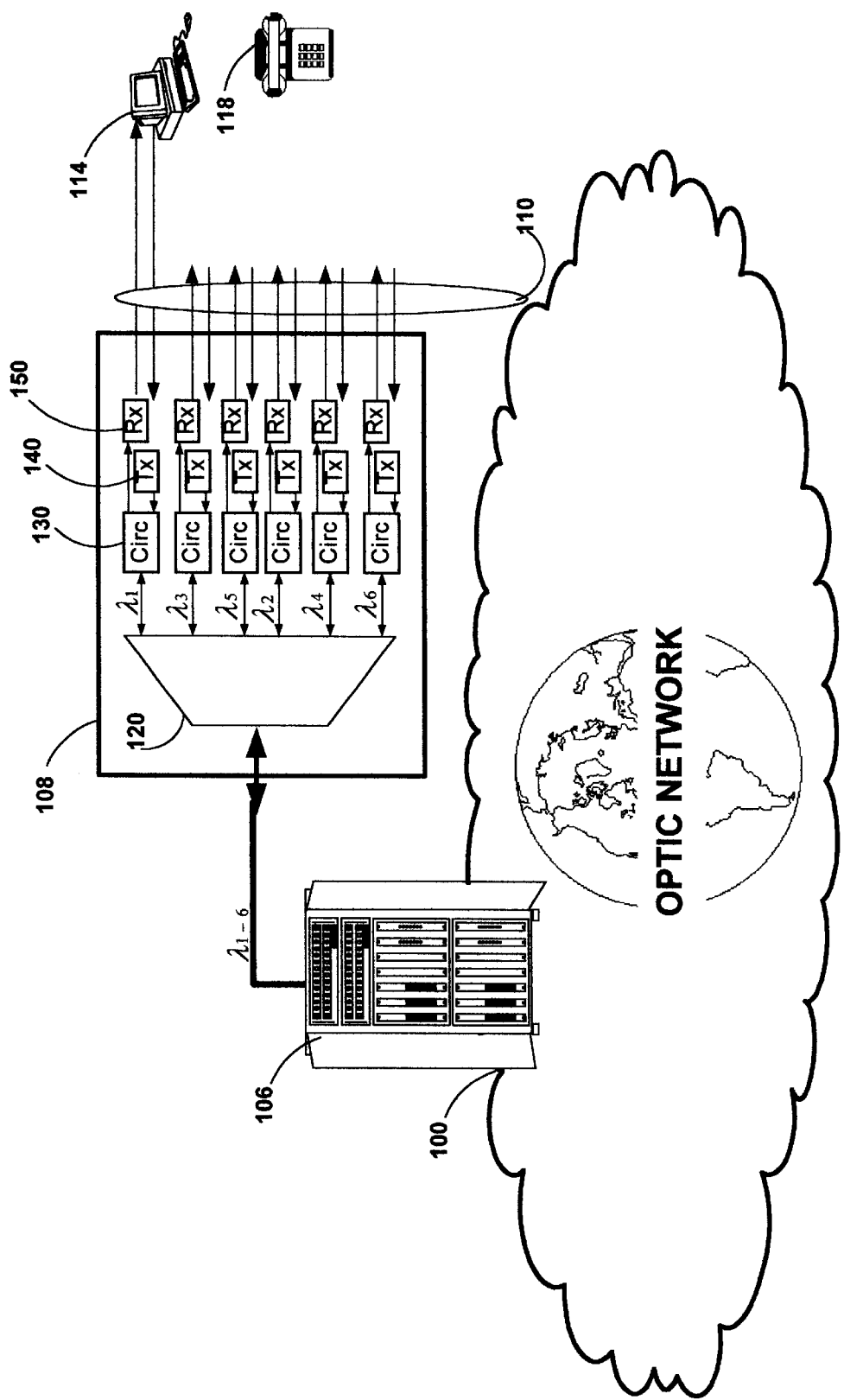
FIG. 1 shows an embodiment of the invention in which an optical network is coupled to a plurality of data and voice subscriber lines by an optical mux/demux utilizing external cavity lasers tunable to the center frequency of any of the wavelength division multiplexed channels on the optical network.

FIG. 1 shows an embodiment of the invention in which an optical network is coupled to a plurality of data and voice subscriber lines by an optical mux/demux utilizing ECL's tunable to the center frequency of any of the WDM channels on the optical network. An optical network 100, a central office or remote terminal 106, a data terminal 114 and voice terminal 118 are shown. The modulated data may be carried on a number of channels in multiple access protocols including but not limited to: wavelength division multiplexing (WDM), dense wavelength division multiplexing (DWDM), frequency division multiple access (FDMA), etc. Currently this expansion of bandwidth is being accomplished by what is known as "wavelength division multiplexing" (WDM), in which separate subscriber/data sessions may be handled concurrently on a single optic fiber by means of modulation of each of those subscriber datastreams on different portions of the light spectrum. The precise center frequencies of each channel are specified by standard setting organizations such as the International Telecommunications Union (ITU). These center frequencies are set forth as part of a wavelength grid which defines the center frequencies and spacing between channels. Typically, the grid spacing is even and occurs at integer multiples of a selected fundamental frequency.

At each node in the network, e.g., central office or remote terminal 106, optical transceivers mounted on fiber line cards, e.g., card 108, are provided. Each line card includes a multi-stage multiplexer/de-multiplexer 120, a circulator bank 130, a transmitter bank 140, and a receiver bank 150. The multiplexer/de-multiplexer is a passive optical device which divides wavelengths (or channels) from a multi-channel optical signal, or combines various wavelengths (or channels) on respective optical paths into one multi-channel optical signal depending on the propagation direction of the light.

In the receive mode, after de-multiplexing, each individual channel is passed via a corresponding circulator within circulator bank 130 to a corresponding receiver in receiver bank 150. Each receiver includes a narrow bandpass photodetector, framer and decoders. Switches (not shown) couple the receiver over the corresponding one of subscriber lines 110 to a voice or data terminal 118, 114, respectively.

In the transmit mode, each line card transmitter bank 140 includes a bank of lasers, e.g., 128 lasers radiating light at one of the selected center frequencies of each channel of the telecommunications grid. The wavelength range of current optical grids is 1525–1575 nm. Each subscriber datastream is optically modulated onto the output beam of a corresponding semiconductor laser. A framer permits framing, pointer generation and scrambling for transmission of data from the bank of 128 or more lasers and associated drivers. The modulated information from each of the semiconductor lasers is passed via a corresponding circulator into the multiplexer 120, the output of which couples with a single optic fiber for transmission. The operation of the line card in the embodiment shown is duplex, meaning that bidirectional communications are possible. Thus, the same device operates as a multiplexer and de-multiplexer.

FIGS. 2AB are isometric side and top views respectively of a tunable external cavity laser according to an embodiment of the current invention. The laser cavity is delimited by the partially reflecting rear facet 226 of the gain medium/laser amplifier 224 and by an external retroreflector 264. Tunable feedback to control the lasing wavelength is provided by the external cavity which is optically coupled to the anti-reflection (AR) side 228 of the gain medium. The effective reflectivity of the external cavity should be much greater than the residual reflectivity of the AR coated front facet so that the grid generator 246 and the channel selector, e.g., interference filter/etalon 252, can deliver sufficient feedback to put the laser in the "strong feedback" regime. The external cavity laser also includes lens 242, channel tuner 254, grid control 248, base 260, output coupling optics 212, and fiber optic 206. The laser amplifier 224 in the embodiment shown is a laser diode.

Structurally, the tunable laser is shown laid out along an optical path 208. Coupling optics 212 are positioned between the back facet 226 of the laser 224 and a fiber optic 206. The laser and coupling optics are mounted to the base 260 by individual mounts 222 and 210 respectively. The fiber optic is coupled by ferrule 204 to an optical coupler 202 which is in turn coupled to base 260. The laser amplifier, in an embodiment of the invention, is a conventional Fabry-Perot laser diode. The front and rear facets 228–226 of the laser diode are aligned with the longitudinal axis 208. The front facet has an AR coating with a reflectivity of less than 0.5%. The rear facet in this embodiment includes a partially reflecting dielectric coating. The proximal end of the external cavity is located at the front facet 228 of the laser diode. The distal end of the external cavity is defined by the retroreflector 222. The cavity itself extends from the rear facet of the gain medium to the retroreflector. The retro reflector 264 is coupled to base 260 via mount 262.

Within the cavity, a channel selector 252, grid generator 246, and cavity-coupling lens 242 are mounted coaxially with the optical path 208. The cavity-coupling lens is attached via mount 240 to the base 260 proximate to the front facet 228 of the gain medium 224. This lens(es) reshapes the divergent beam emitted from the gain medium for proper coupling to the external cavity. The grid generator in the embodiment shown is a temperature stabilized etalon that precisely references a selected wavelength grid by allowing feedback to the laser of pass bands centered about the wavelengths of the selected wavelength grid, on which communication channels will be established. In the embodiment shown the optical characteristics of the grid generator are temperature controlled so as to maintain alignment between the pass bands of the grid generator and a selected wavelength grid. The temperature of the grid generator may be controlled via a first thermal actuator 244 under the control of the grid controller 248. In the embodiment shown the first thermal actuator couples the grid generator to the base 260. In an alternate embodiment of the invention the first thermal actuator extends the full length of the base 260, and is used to temperature regulate all components within the cavity with the exception of the channel selector which is separately temperature regulated. The grid controller 248 contains logic for controlling, via temperature, the pass band characteristics of the grid generator. This may include closed loop feedback of temperature, wavelength etc.

The grid generator 246 operates as a filter, e.g., an interference filter with a thickness Lg and index of refraction $n_g$ chosen such that its loss spectrum comprises a multiplicity of minima within the communications band at wavelengths that coincide with the center wavelengths of the selected wavelength grid. More generally the grid generator filter function results in a plurality of passbands centered on each of the gridlines of the selected wavelength grid. (See FIGS. 4A–B and 5A–C). The grid generator has a finesse that suppresses neighboring modes of the laser between each channel. In this embodiment of the invention the grid generator is an interference element, e.g., a parallel plate solid/gas etalon. The grid generator is precisely dimensioned to have a free spectral range ($FSR_{Grid\_Gen}$) corresponding to the spacing between wavelengths/gridlines of a selected wavelength grid, e.g., an ITU grid (See FIGS. 4A–B and 5A–C). In this embodiment of the invention the grid generator is fixed to the base 260.

In alternate embodiments of the invention the grid generator or channel selector may be implemented with a diffraction element, an interference element, or a birefringent element. In still another embodiment of the invention, the gain medium itself may serve as either the grid generator or the channel selector. In this embodiment both facets of the gain medium would retain some reflectivity and comprise the grid generating or channel selecting element. In general the free spectral range of the etalon thus formed would depend on temperature, diode current and photon flux. Properly controlled, the combination of optical feedback from the diode facets and that provided by the external cavity would yield the same vernier tuning behavior.

The channel selector 252 also operates as a filter, e.g., a Fabry-Perot filter, an interference filter, etc., with constructive interference, that results in a plurality of passbands differing from the first pass bands by an amount corresponding substantially inversely with the number of channels of the selected wavelength grid. This relationship allows "vernier" tuning of the output wavelength of the laser to a selected wavelength on the wavelength grid. The finesse of the grid generator and channel selector is chosen to suppress channels adjacent to the selected channel. In an alternate embodiment of the invention the second pass bands have a periodicity corresponding with the gain bandwidth of the gain medium.

In this embodiment the channel selector includes a gas or solid etalon 252. The etalon includes opposing planar first and second reflectors which are highly reflective, e.g., R>90%. The channel selector is dimensioned to have a free spectral range ($FSR_{Channel\_Selector}$) differing from that the grid generator ($FSR_{Grid\_Gen}$) by an amount corresponding substantially inversely with the number of channels in the wavelength grid. Both free spectral ranges of the grid generator and channel selector are broader than the free spectral range of the cavity ($FSR_{Cavity}$) (See FIGS. 4A–B and FIGS. 5A–C). In an embodiment of the invention, the FSR of the channel selector differs from the FSR of the grid generator by an amount which substantially corresponds to the quotient of the channel spacing and the number of channels in the wavelength grid, e.g., an ITU grid (See FIGS. 4A–B and FIGS. 5A–C). Vernier tuning of the channel selector results in a single loss-minimum within the communications band which can be tuned across the grid. The combined feedback to the gain medium from the grid generator together with the channel selector supports lasing at the center wavelength of the selected channel and substantially attenuates all other channels (See FIGS. 4A–B and FIGS. 5A–C).

Channel selection in this embodiment of the invention is brought about by changes in the optical path length 256 of the channel selector. This in turn may result from either or both a change in the index of refraction of the channel selector 252 or of its thickness along the optical path, which in this case is aligned with the "z" axis. In the embodiment shown, the second thermal actuator 250 provides a temperature sink/source to decrease/increase the temperature of the channel selector 252 under the control of the channel tuner 254. This decreases/increases the optical path length of the channel selector. The FSR of the channel selector varies during tuning, but the variation is slight, e.g., less than +/−1%. This is a result of the fact that the tuning range of the channel selector is limited to a range of one channel spacing within the wavelength grid.

The temperature control of the device may include individual temperature control of: the grid generator 246, the base 260, and the gain medium 224. The channel tuner and the grid control include logic for tuning the channel selector 252 and for maintaining the reference characteristics of the grid generator 246 respectively. These modules may be implemented separately or in combination. They may be implemented with open or closed loop feedback of temperature, wavelength, position etc. A single processor with appropriate program code and lookup table(s) may be used to control both the channel tuner and grid control. In an embodiment of the invention the lookup table contains data or formula which correlate wavelength of either/both the channel selector 252 or the grid generator 246 with the control variable(s). In the above discussed embodiment the control variable is temperature. In alternate embodiments of the invention the control variable(s) include: position, rotation, temperature, electrical parameters, electro-optic parameters etc. The lookup table(s) may contain a formula or a plurality of records which correlate the pass band characteristics of either or both the channel selector and the grid generator with a specific control variable, e.g. tuning parameter, appropriate for the manner in which selector/generator is being tuned/regulated. Tuning/regulation may be accomplished by mechanical, electrical or opto-electrical tuning device. Mechanical parameters include positions of the channel selector, (See FIG. 3A). Electrical parameters include current, voltage, capacitance, and inductance. Opto-electric parameters include index of refraction and birefringence. The parameters may be input for a group of similar devices or may be individually calibrated for each device, using a wavelength meter during assembly of the device.

In an embodiment of the invention, the calibration of the ECDL may be accomplished by a processor which sweeps the channel selector through the entire tuning range pausing at increments along the tuning range to allow a wavelength meter to correlate the measured wavelength with the center wavelengths of each channel of the selected wavelength grid. As each center wavelength is detected or interpolated, the tuning parameter corresponding with that parameter is measured as well. These correlations are then written to the memory 294 as individual records or as a formula from which individual records may be calibrated. With the wavelength information thus embedded in the assembled lasers on-board memory, the tunable laser may be shipped with only the channel tuner 254 and the grid control 248 and without the wavelength meter. The absence of a closed loop control for tuning results in reduced form factor, cost and complexity in the subject instrument. In alternate embodiments of the invention either or both the channel tuner and the grid control may be equipped with sensors to form a closed loop feedback control system.

In an alternate embodiment of the invention the device may be fine tuned by logic controlling the temperature of any one or all of: the gain medium, the base, and the grid generator to maintain the accuracy of the selected center frequencies with those of the selected wavelength grid. The device may be fine-tuned by logic which senses the output of the laser and compares the output with a master reference etalon. This process generates a fine-tuning signal to the transmitter's internal temperature controller for the purpose of aligning the internal reference to the master. This process need not be conducted continuously but can be applied intermittently to correct for long term drifts due to thermistor aging or other factors.

In FIG. 2A the output beam 266 is shown passing through the partially reflective back facet of the retroreflector 264 while output beam 220 is shown passing through the partially reflective back facet 226 of the laser diode 224. In a typical device only one output beam, either 266 or 220 would be available, with the other blocked by a highly reflective coating on the corresponding one of the retroreflector or the back facet of the laser diode. The coupling of an output beam, either 266 or 220 to an optic fiber is provided by an optical coupler 202. The optical coupler may include lenses and a feedback blocker, e.g. a non-reciprocal element. In the embodiment shown the optical coupler couples to the fiber optic 206 via ferrule 204. This assembly couples the fiber optic to the output beam 220. In this embodiment the retroreflector is fully reflective and the back facet 226 of the diode 224 is partially reflective, thus providing an output beam from the back facet. In an alternate embodiment of the invention the output beam would be tapped from the back facet of the retroreflector. Tapping the output beam from the retroreflector back facet has the added benefit of providing lower source spontaneous emission since the output beam makes a complete pass through all optics in the system.

In alternate embodiments of the invention tilting of either or both the grid generator and the channel selector may be implemented to reduce spurious feedback to the gain medium. In FIG. 2B the channel selector is shown tilted 270 about the y axis so that its face is no longer normal to the optical axis, in this case the "z" axis. This reduces-spurious feedback to the gain medium. In still other embodiments of the invention a one way filter system may be added to the cavity to further reduce spurious feedback to the gain medium. Such a system may employ quarter wave plates positioned on either side of the grid generator and channel selector. Since the output beam of the laser is polarized, the quarter wave plates block the return of light to the gain medium that has not made a dual pass through both the grid generator and channel selector. In either embodiment the close proximity of the components and fiber allows integration of these components into a highly-stable opto-mechanical subsystem that can be hermetically sealed and plugged into the external cavity, thus enhancing tolerance to ambient temperature, shock, and vibration.

Figures 3A, 3B:
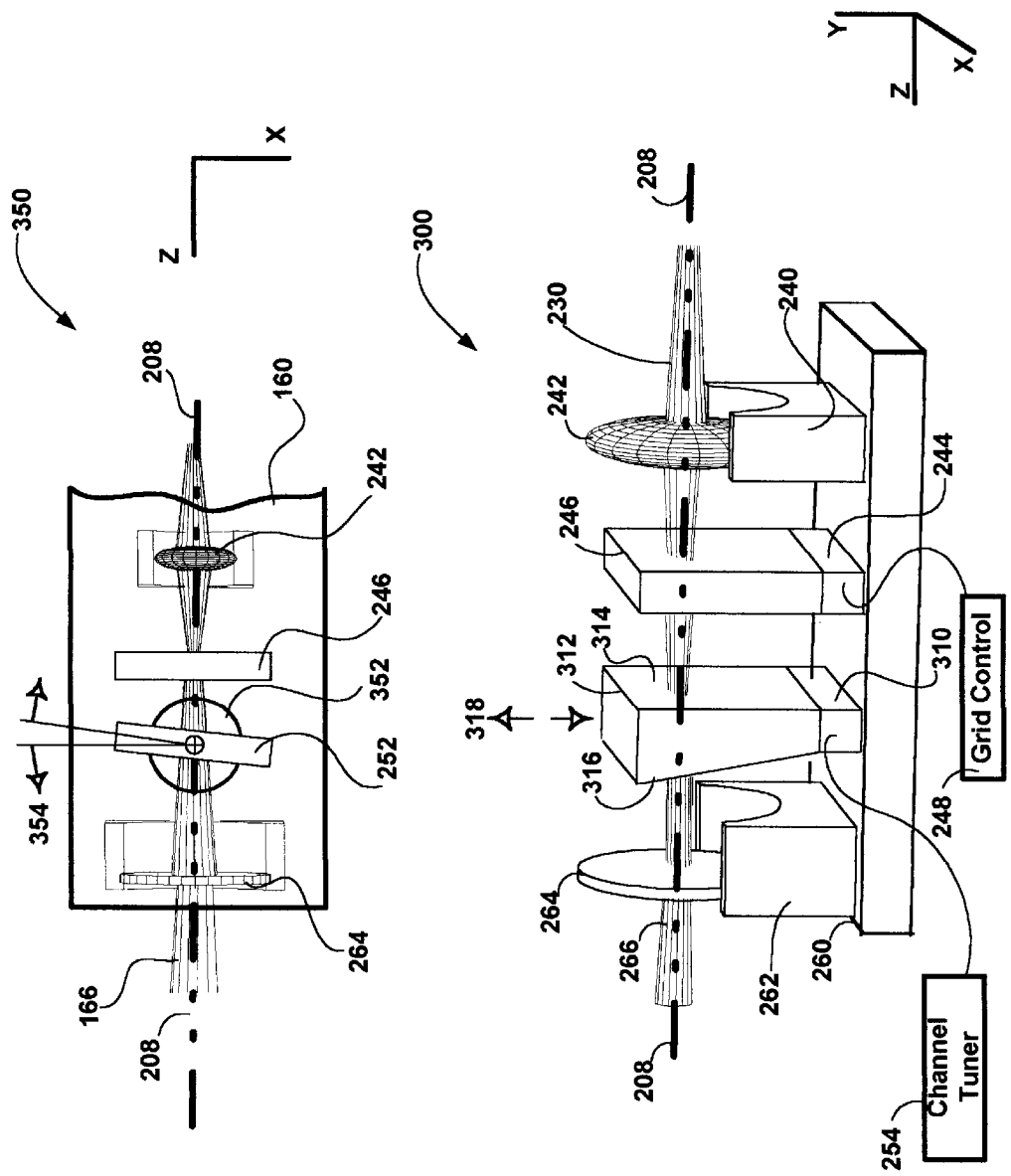
FIGS. 3A–B are isometric and top views respectively of alternate embodiments of the external cavity laser shown in FIGS. 2A–B.

FIGS. 3A–B are isometric and top views respectively of alternate embodiments of the external cavity laser shown in FIGS. 2A–B.

In FIG. 3A an embodiment of the channel selector is shown in which a wedge shaped solid/gas etalon 312 is employed. The etalon includes opposing reflective surfaces 314–316 at an angle to one another. Tuning is brought about by moving the wedge along the y axis across the optical path. Tuning results from the variation in the thickness of the channel selector along the optical path 208 as it is moved across the beam 230. This movement is brought about by a position actuator 310. In the retracted position, the beam traverses relatively thicker portions of the etalon. In the extended position, the beam traverses a relatively thinner portion of the etalon. Thus, in the extended position of the etalon, the etalon supports shorter wavelength channels at which constructive interference takes place between the reflective surfaces of the etalon. In the retracted position, the etalon supports longer wavelength channels. The required range of motion 318 of the position actuator 310 along the "Y" axis may be in the centimeter range in practice.

The channel tuner 254 provides the electrical impulse to control the expansion and contraction of the actuator 310. Suitable actuators may deliver linear or arcuate displacement and include but are not limited to: stepper motors, DC servomotors, solenoids, voice-coils, ultrasonic motors, shape-memory actuators, piezo electrics, thermal expansion mechanisms, etc. The channel selector may be implemented with other optical elements including: diffraction elements, interference elements other than gas/solid etalons, and birefringent elements. Tuning may be brought about, mechanically, electrically, and electro-optically.

In an alternate embodiment of the invention shown in FIG. 3B tuning of the channel selector 252 is brought about by rotation 354 of the channel selector about an axis normal to the beam, e.g. the y axis. In this embodiment the channel selector may be implemented with a parallel plate etalon with a rotary actuator 352 to vary the angle at which it intersects the optical path.

In still other embodiments of the invention, the channel selector may be implemented as an air gap etalon with a piezo electrically actuated gas-filled gap to vary the refractive index of the gap (Not shown). The channel selector may be implemented as a Fabry-Perot etalon with an electro-optically tunable spacer medium, such as a liquid crystal (Not shown).

The channel selector may be implemented with a diffraction element and a rotary actuator to vary the angle at which the grating intersects the optical path. Tuning is accomplished by varying the angle of incidence of the beam on the surface of the grating. The FSR of the grating is designed to differ from that of the grid generator by an amount corresponding substantially inversely with the number of channels in the wavelength grid. In an embodiment of the invention the difference corresponds substantially to the quotient of the channel spacing and the number of channels in the wavelength grid.

The channel selector may be implemented with a birefringent material, gas, liquid or crystal which provides a variable optical path length in response to a stimulus, electrical or mechanical. Examples of birefringents with electro-optic properties include Pockels and Kerr cells (Not shown).

In still another embodiment of the invention either or both the grid generator and the channel selector may be implemented with silicon. The silicon may be temperature controlled by direct current-induced heating with cooling provided by a global thermo-electric cooler. Alternately, current could be used to achieve the required index change since silicon undergoes index-of-refraction variation with current. P-N junctions may be exploited to create high-injection conditions if required.

Figure 4:
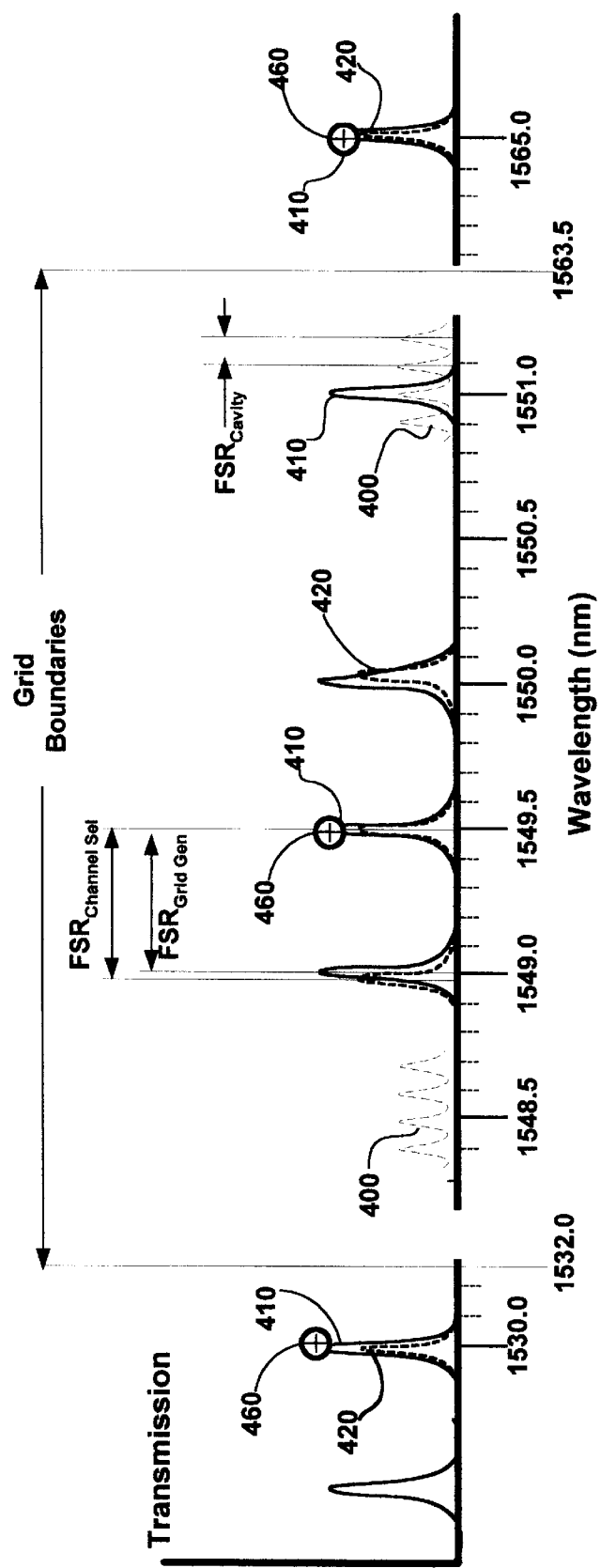
FIG. 4 is a graph showing pass bands for the laser cavity, the grid generator, and the channel selector with respect to a selected wavelength grid.

FIG. 4 is a graph of the individual filter characteristics, i.e., pass bands for the laser cavity 400, the grid generator 410, and the channel selector 420 with respect to a selected channel grid. Gain is shown on the y-axis and wavelength on the x-axis. Each may have specific periodic relationships to the other. The periodic peaks, i.e. pass bands 400 of the cavity, in an embodiment of the invention periodically align with the center wavelengths of each of the channels in the wavelength grid. In the example shown, that grid extends over 64 channels periodically spaced apart at approximately 0.5 nm or 62 GHz intervals, between the shortest wavelength channel 1532 nm to the longest wavelength channel 1563.5 nm. The periodic peaks, i.e. pass bands 410 of the grid generator, periodically align with each center wavelength of each channel in the selected wavelength grid. The channel selector exhibits substantially the same number of periodic peaks 420 within the bandwidth of the wavelength grid as does the grid generator but they differ in periodicity. More specifically, the channel selector will have one more or one fewer peaks than the grid generator within the tunable bandwidth of the wavelength grid. Thus the pass bands of the grid generator and channel selector are shown aligned at three locations 460 only one of which lies within the selected wavelength grid.

These relationships are expressed in the following Equation 1A–B.

$$FSR_{GridGen} \approx i \cdot FSR_{Cavity} \qquad \text{Equation 1A}$$

$$FSR_{ChanSel} \geq \approx \frac{M}{M \pm 1} \cdot FSR_{GridGen} \qquad \text{Equation 1B}$$

where i is an integer indicating the number of laser modes between gridlines and M is the total number of channels within the selected wavelength grid. Thus the $FSR_{ChanSel}$ differs from the $FSR_{GridGen}$ by an amount substantially corresponding to $1/M * FSR_{GridGen}$. The lasing modes are governed not only by vernier tuning of the two etalons but also by the cavity round-trip phase condition. Good mode performance may be achieved either by designing the cavity length as an integer sub multiple of the $FSR_{GridGen}$ as discussed above or by making the cavity length variable. This latter result may be achieved by, for example, independent temperature control of the gain medium, or end mirror or other intracavity element.

Equation II expresses the FSR of the grid generator as a finction of the optical pathlength of the grid generator and the spacing between channels in the wavelength grid:

$$FSR_{GridGen} = \left(\frac{1}{2}\right)\frac{c}{n_g \cdot L_g} \approx \text{Channel\_Spacing} \qquad \text{Equation II}$$

where c is the speed of light in a vacuum, $n_g$ is the refractive index of the grid generator and $L_g$ is the length along the optical path of the grid generator. For the grid generator assuming an index of refraction of 1.0 and a channel spacing of 0.5 nm or approximately 62 GHz the thickness would be approximately equal to 2 mm.

FSR of Grid Generator and Tuner

Equation III expresses the FSR of the channel selector as a function of the optical path length of the channel selector and the bandwidth of the wavelength grid and as a finction of the channel spacing and the number of channels:

$$FSR_{ChanSel} = \left(\frac{1}{2}\right)\frac{c}{n_s \cdot L_s} \approx FSR_{GridGen} \pm \frac{FSRGridGen}{M} \quad \text{Equation III}$$

where $n_s$ is the refractive index of the channel selector and $L_s$ is the length along the optical path of the channel selector and M is the number of channels. For 128 Channels at 50 GHz spacing the FSR of the grid generator would be 50 GHz, and the difference in free spectral range for the tuner would be +/−0.39 GHz, i.e. 50.39 GHz or 49.61 GHz.

Equation IV expresses the FSR of the overall cavity as a function of channel spacing:

$$FSR_{Cavity} = \left(\frac{1}{2}\right)\frac{c}{\sum n_j \cdot L_j} \approx \frac{Channel\_Spacing}{j} \quad \text{Equation IV}$$

where j is an integer series corresponding to each element, lens, gain medium, etalons, gratings, etc. and including air/gas within the combined internal and external cavities and $n_j$ is the refractive index of the $j_{th}$ element in the cavities and $L_j$ is the length along the optical path of the $j_{th}$ element in the cavity. The cavity length would be approximately 12 mm assuming an index of refraction of 1.0 and a mode spacing of ¼ the channel spacing, i.e. 12.4 GHz or about 0.1 nm.

When the grid generator and channel selector are optically coupled in an ECDL to provide feedback to the gain medium, the following relationship is attained in which the combined effect of the filters is the product of their individual transmission characteristics. The grid generator selects periodic longitudinal modes of the cavity at intervals corresponding to the channel spacing and rejects neighboring modes. The channel selector selects a channel within the wavelength grid and rejects other channels.

In an alternate embodiment of the invention M is chosen to equal a subset of the total number of channels within the selected wavelength grid. For example, if M equals half the number of wavelengths in the overall wavelength grid, then the channel selector can be used to pick out every second channel, e.g. odd or even channel without departing from the scope of the claimed invention.

Figure 5A:
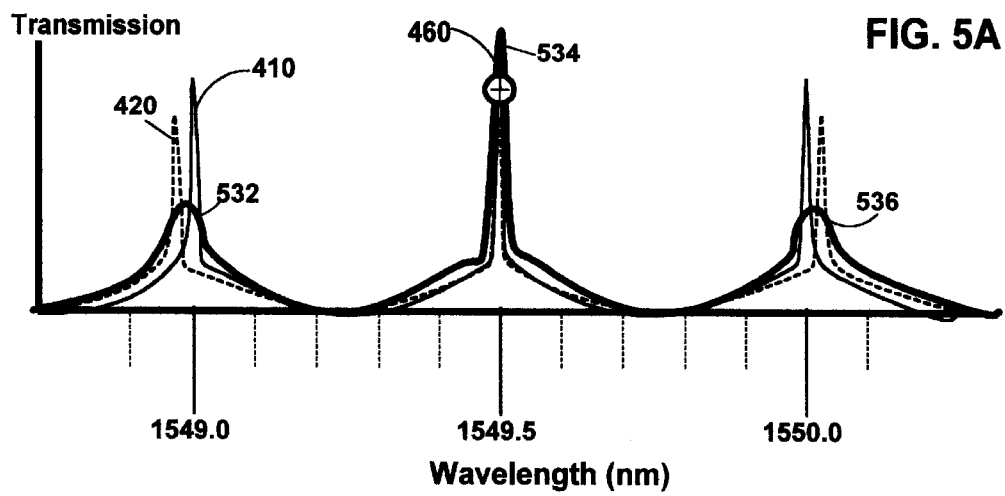
FIGS. 5A–C are graphs showing the gain for each of a plurality of channels on a WDM grid responsive to tuning of the external cavity laser.
Figure 5B:
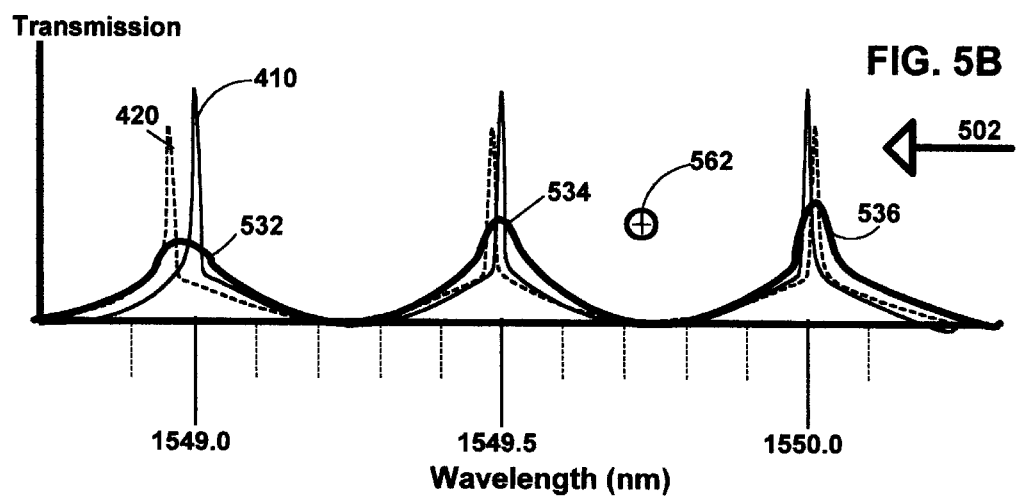
Figure 5C:
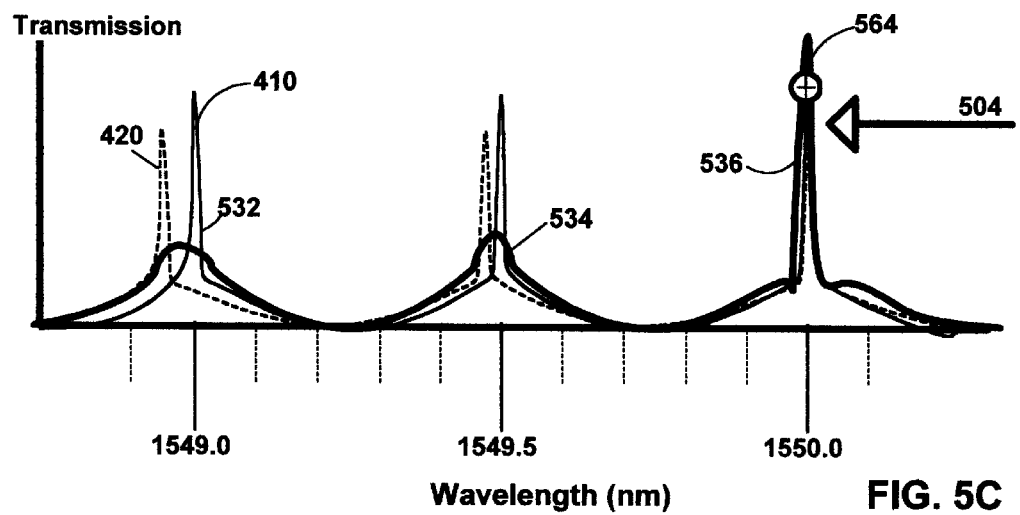

FIGS. 5A–C show graphically the tuning of the channel selector bandpass between a channel centered at 1549.5 nm and an adjacent channel at 1550 nm. The selection of a mode, i.e., channel, generated by the grid generator and the attenuation of adjacent modes/channels is also shown.

In FIG. 5A the grid generator pass bands 410 are shown tuned 460 with the channel selector pass bands 420 at 1549.5 nm. That results in a maximum combined transmission peak 534 for the grid generator and channel selector at 1549.5 nm. At the neighboring channels, i.e. 1549.0 nm and 1550.0 nm the combined transmissions 532 and 536 respectively, are severely attenuated by comparison. The amount of attenuation is a function of the finesse of the channel selector and grid generator as will be discussed below.

In FIG. 5B the pass bands of the channel selector have been shifted 502 to a shorter wavelength. The wavelength selected by this tuning 562 falls between the channel centered at 1549.5 nm and the channel at 1550.0 nm. As a result the combined transmission profiles 532–536 of the grid generator and channel selector at 1549.0 nm, 1549.5 nm and 1550.0 nm are minimized since at none of these wavelengths do any of the pass bands align.

In FIG. 5C the pass bands of the channel selector have been shifted 504 still further toward shorter wavelengths. The wavelength selected by this tuning 564 falls on the channel centered at 1550.0 nm. This results in a maximum combined transmission peak 564 for the grid generator and channel selector at 1550.0 nm. At the neighboring channels, i.e. 1549.0 nm, 1549.5 nm and 1550.5 nm (not shown) the combined transmissions 532 and 536 respectively, are severely attenuated by comparison.

Figure 6:
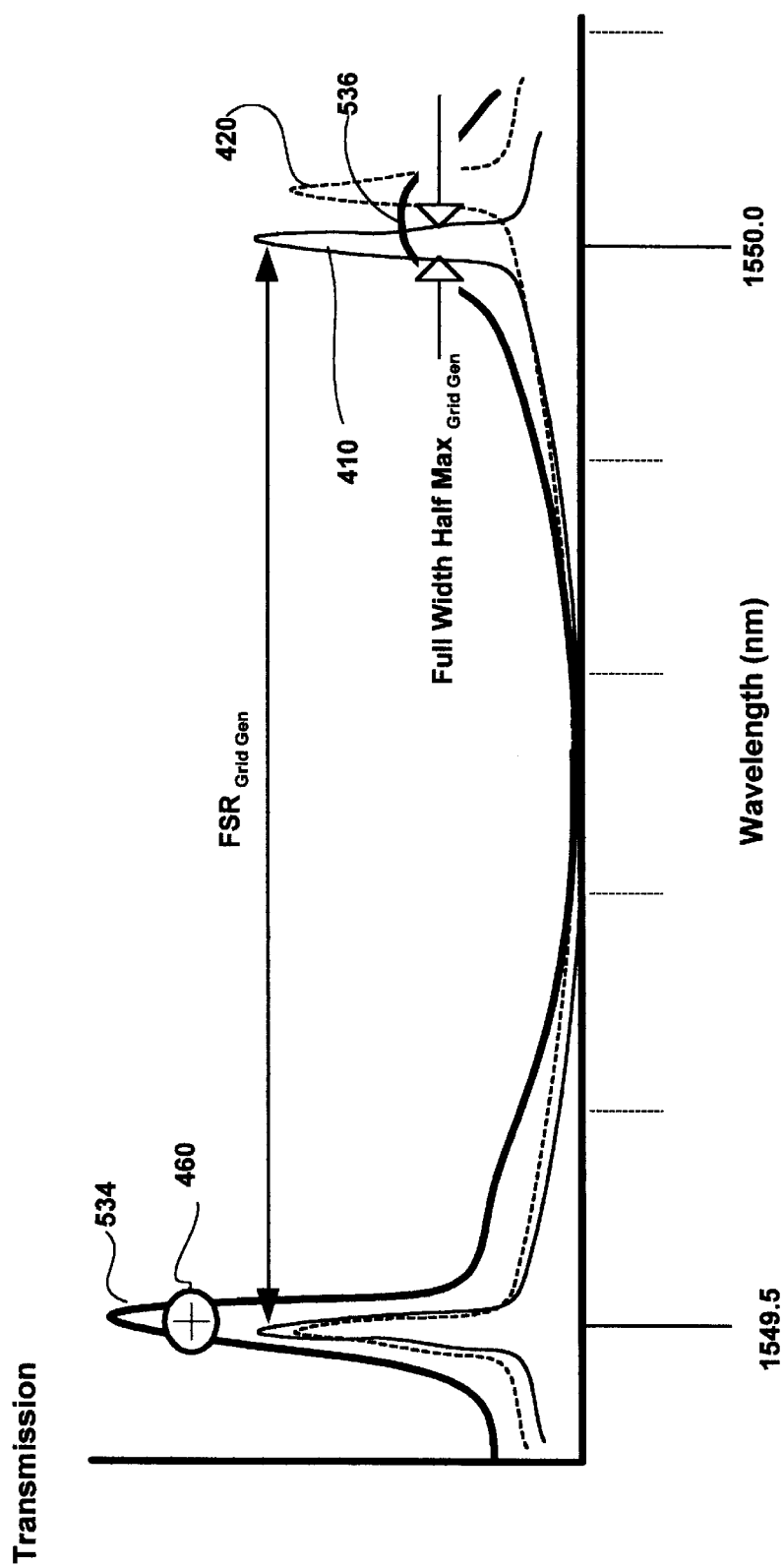
FIG. 6 is a graph of transmission vs. wavelength for the combined filter function of the grid generator and channel selector.

FIG. 6 is a graph of transmission vs. wavelength for the combined filter function of the grid generator and channel selector. As a measure of the sharpness of the filter transmission profiles, the half width of each filter, a.k.a. full-width at half maximum (FWHM), of each filter, e.g., the channel selector and the grid generator, determines the attenuation of nearest neighboring laser modes or channels. The positioning of both the grid generator and channel selector within the oscillator, i.e. the ECL cavity, further improves the spectral purity of the laser output and results in improved sidemode suppression. The free spectral range and transmission half width of the grid generator peak 410 are indicated with arrows. The half-width γ is a measure of the sharpness of the peaks, that is, how rapidly the transmission drops off on either side of a local maximum. Half-width is described as the full width at half maximum (FWHM).

Finesse

The filter half widths may be optimized for use in a given EDL by choice of surface reflectivities since Finesse, the ratio of free spectral range to half width, is related to reflectivity. Finesse is the ratio of the separation of adjacent maxima to the half-width of the peak as expressed in the following Equation Va.

$$Finesse = \frac{FSR}{\gamma} \quad \text{Equation Va}$$

Equation Vb expresses the finesse of the grid generator in terms of the number of accessible channels. The finesse of the channel selector may differ slightly without significant effect.

$$Finesse = \frac{FSR_{GridGen}}{F_{whm}} \approx k \cdot M \quad \text{Equation Vb}$$

where k is an extinction coefficient representing the degree of extinction between a transmission maximum at the selected channel and the transmission at its nearest neighbor and M is the number of channels in the selected wavelength grid. When extinction of 50% is required for neighboring channels, the coefficient k has the value 0.8. Thus in an embodiment of the invention finesse is substantially equal to the number of channels in the selected wavelength grid. Single mode laser performance with substantial side-mode suppression due to the regenerative behavior of the cavity may be obtained with even less extinction, which will in practice allow good laser performance for smaller values of k, or for lower finesse grid and selector filters. In these latter embodiments of the invention it is possible that finesse may be relaxed to ½ or ⅓ the number of channels in the wavelength grid when the side-mode suppression of the cavity is considered.

The following two paragraphs describe the derivation of the factor k used in Equation V. A simple figure-of-merit can be derived relating the required etalon Finesse to the channel spacing and number of required channels. For two etalons with Gaussian transmission peaks, the peak combined transmission is $\exp(-\Delta\omega^2/\omega_o^2)$ where $\Delta\omega$ is the separation between the individual transmission peaks and $\omega_o$ is the $1/e^2$ half-width of the individual transmission peaks. Assuming that the required suppression of transmission to guarantee single-mode lasing is 0.5, we find that $\Delta\omega=\text{sqrt}(\ln(2))*\omega_o$ which approximately equals $0.8*\omega_o$. That is k=0.8.

The maximum tuning range is established by the frequency difference between the nearest two overlapping transmission peaks. The smaller the frequency offset, the greater the distance to the next overlapping peak. In other words, the ballpark figure for tuning range is the etalon Finesse times the channel spacing. The laser can address a number of channels approximated by its Finesse, regardless of the channel spacing. Since 50 GHz is approximately 0.4 nm near 1.5 μm wavelengths, an etalon Finesse of 200 gives 200 addressable 50 GHz channels, or a tuning range of 80 nm. Allowing for the possibility of smaller k values, one sees that practical finesse values of 100 or less can be used to address many channels.

EXAMPLE

From a default configuration, where the laser frequency is selected at the wavelength of overlap between the two etalons, the laser can be tuned. As the temperature of the second etalon is changed, it's free-spectral range will change. Given enough change in $FSR_2$, the overlap wavelength will "snap" by $FSR_1$, and a new laser frequency will be selected. One can select $FSR_1$=50 GHz, for example, which corresponds to approximately 2 mm of BK7 glass.

The following example shows how to determine the required optical path length change (e.g. a combination of thermal expansion and temperature dependent index change) to achieve a single channel snap. Assuming a channel spacing of 50 GHz and that the grid generator is 1.999 mm of BK7, with a $FSR_{GridGen}$=50 GHz. If the Finesse is 200, the transmission $1/e^2$ half-width is $\omega_o$=FSR/F=0.25 GHz, and for simplicity, we can choose $FSR_{ChannelSel}$=50.25 GHz. The thickness of the channel selector etalon is therefore 1.989 mm. The wavelengths of interest where these two etalon transmission peaks overlap is 1.492 um. This is the $4019^{th}$ order of $FSR_1$ and the $3999^{th}$ order of $FSR_{ChannelSel}$.

If this laser is to be tuned by one channel, it will operate on the $4020^{th}$ order of $FSR_{GridGen}$, and the $4000^{th}$ order of the adjusted $FSR_{ChannelSel}'$. The new wavelength will follow the relation $(N_1+1)*FSR_{GridGen}=(N_2+1)*FSR_{channelSel}'$ where $N_1*FSR_{GridGen}=N_2*FSR_{ChannelSel}$. This can be used to determine how much change is required by relating $FSR_{ChnnelSel}$ to $FSR_{ChannelSel}'$. Thus, for the example given, $FSR_{ChannelSel}'/FSR_{ChannelSel}=1+1.2*10^{-6}$ or a difference of 0.00012%.

This $10^{-6}$ change in optical path length in BK7 from a nominal 2 mm*1.5 requires only about a 0.053 K temperature change. The coefficient of thermal expansion is $\alpha=7.1*10^{-6}$, and the coefficient of index of refraction change is $8.7*10^{-7}$ at 1.5 um. So a change in d(nL)/dT= L*dn/dT+n*dL/dT=L*(dn/dT+n*α). Substituting, we find d(nL)/dT=2.3*10$^{-5}$ mm/K, which is enough to reach the path length change specified above with a 0.053 K temperature change. Interestingly, for BK7, the primary change is due to the physical length change of the glass, not the index of refraction.

Figure 7:
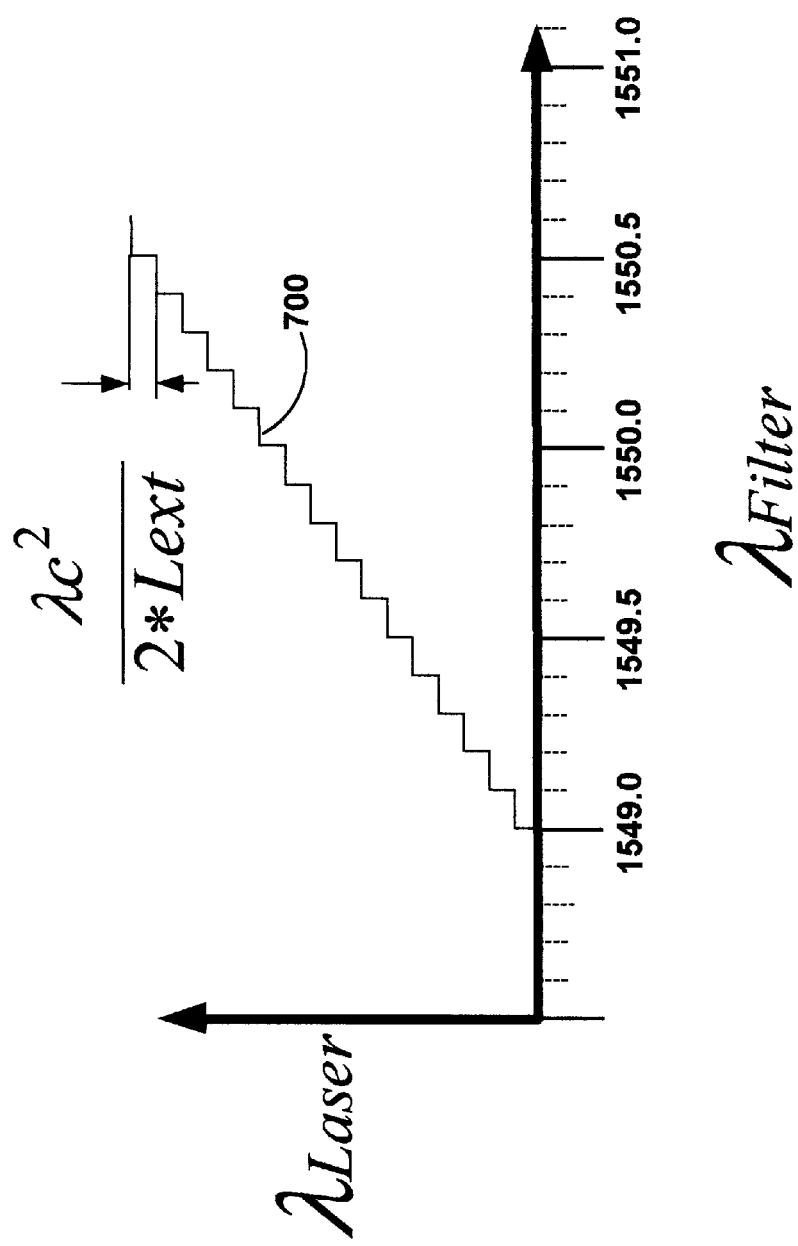
FIG. 7 is a graph which shows the discreet tuning of the external cavity laser shown in the accompanying FIGS. 2–3.

FIG. 7 is a graph which shows the tuning characteristic of the external cavity tunable laser discussed above. External cavity lasers for test and measurement applications typically are designed to have a loss minimum that varies continuously with respect to the tuning control variable, resulting in a linear tuning characteristic that provides complete, continuous wavelength coverage over a specified range. In contrast, the laser of the present invention is designed to have a distinctly discontinuous, discrete, staircase-tuning characteristic.

The graph shows lasing wavelength versus the selected center wavelengths of the wavelength grid. In an embodiment of the invention, the optical path length of the cavity, including optical elements as well as the air or gas which fills the void between elements, is designed so that selected modes of the cavity align with the center frequency of the channels of the wavelength grid. The characteristic has a staircase shape 700 that is highly desirable. Due to this shape, the position tolerance of the channel selector is greatly relaxed, so that the selector can be controlled in an open-loop manner using a lookup table. This provides the obvious benefit of making closed-loop feedback control unnecessary. The wavelengths of the longitudinal modes of the laser cavity are related to the cavity length by $$L_{ext} \approx m \cdot \frac{\lambda_m}{2}$$

where m is an integer referred to as the mode number. Typically m>10$^3$. The laser may only oscillate at wavelengths that are longitudinal modes. The mode spacing is approximately $$\frac{\lambda_c^2}{2L_{ext}}$$

where $\lambda_c$ is the center of the tuning range. Therefore, if the cavity length remains constant as the filter/etalon peak is tuned, the laser output will change discontinuously, giving rise to a tuning characteristic known as mode-hop tuning.

The foregoing description of a preferred embodiment of the invention has been presented for purposes of illustration and description. It is not intended to be exhaustive or to limit the invention to the precise forms disclosed. Obviously many modifications and variations will be apparent to practitioners skilled in this art. It is intended that the scope of the invention be defined by the following claims and their equivalents.

What is claimed is:

1. A tunable laser comprising:
    a gain medium to emit an optical beam into a laser cavity;
    first means for filtering the optical beam to define a first plurality of pass bands substantially aligned with corresponding channels of a selected wavelength grid, disposed in the laser cavity;
    second means for filtering the optical beam to define a second plurality of pass bands within the selected wavelength grid, disposed in the laser cavity adjacent to the first means for filtering the optical beam;
    means for optically providing feed back to the gain medium corresponding with the first and second pluralities of pass bands; and
    means for tuning the second plurality of pass bands with respect to the first plurality of pass bands to select channels at which to tune the optical beam.

2. The tunable laser of claim 1, wherein the means for tuning shifts the second plurality of pass bands across a range substantially equal to one channel spacing within the selected wavelength grid to tune channels throughout the selected wavelength grid.

3. The tunable laser of claim 1, wherein the means for tuning further comprises:

means for selecting either subsets of the channels throughout the wavelength grid or discrete channels throughout the wavelength grid.

4. The tunable laser of claim 1, wherein the means for filtering the optical beam to define a first set of pass bands comprises:

means for generating a first interference within the optical beam with a first free spectral range substantially corresponding to the selected wavelength grid.

5. The tunable laser of claim 4, wherein the means for filtering the optical beam to exhibit define a second set of pass bands further comprises:

means for generating a second interference within the optical beam with a second free spectral range which differs from the first spectral range by an amount substantially equal to the quotient of the first free spectral range divided by one of the number of channels of the selected wavelength grid or the quotient of the first free spectral range divided by a subset of the number of channels of the selected wavelength grid.

6. The tunable laser of claim 1, wherein the first plurality of pass bands have transmission peaks defining a first free spectrum range and the second plurality of pass bands have transmission peaks defining a second free spectrum range and the means for tuning comprises:

means for shifting the second plurality of pass bands relative to the first plurality of pass bands to align one of the transmission peaks from the second plurality of pass bands with a transmission peak from the first plurality of pass band having a frequency or wavelength corresponding to a selected channel.

7. The tunable laser of claim 1, wherein the first plurality of pass bands have transmission peaks defining a first constant free spectrum range and the second plurality of pass bands have transmission peaks defining a second free spectrum range that may be varied, and the means for tuning comprises:

means for adjusting the second free spectrum range to align one of the transmission peaks from the second plurality of pass bands with a transmission peak from the first plurality of pass bands having a frequency or wavelength corresponding to a selected channel.

8. The tunable laser of claim 1, further comprising means for storing tuning parameters used to tune the tunable laser.

9. The tunable laser of claim 8, wherein the means for storing tuning parameters comprises a memory in which a lookup table of parameters are stored.

10. A tunable laser comprising:

a gain medium to emit an optical beam into an external laser cavity;

a grid generator, disposed in the external laser cavity, responsive to the optical beam to generate a first plurality of transmission peaks substantially aligned with corresponding channels within a wavelength range of a selected wavelength grid;

a channel selector, disposed in the external laser cavity adjacent to the grid generator, for selecting channels to which to tune the optical beam by generating a second plurality of transmission peaks within the wavelength range and tuning the second plurality of transmission peaks relative to the first set of transmission peaks such that a single pair of respective transmission peaks from among the first and second plurality of transmission peaks are aligned; and a retroreflector for optically coupling the grid generator and the channel selector to provide feedback to the gain medium, said gain medium and said retroreflector defining respective ends of the external laser cavity.

11. The tunable laser of claim 10, wherein the channel selector effects a tuning range for the second set of transmission peaks substantially equal to one channel spacing within the wavelength grid thereby to tune to selected channels throughout the entire selected wavelength grid.

12. The tunable laser of claim 10, wherein the channel selector selects one of discrete channels throughout the wavelength grid and subsets of the channels throughout the wavelength grid.

13. The tunable laser of claim 12, wherein the subsets of the channels includes a subset of odd channels and a subset of even channels.

14. The tunable laser of claim 10, wherein the gain medium comprises a laser diode.

15. The tunable laser of claim 10, wherein the grid generator defines a first optical path length determinative of a first free spectral range substantially corresponding to a spacing between adjacent gridlines of the selected wavelength grid.

16. The tunable laser of claim 6, wherein the channel selector defines a second tunable optical path length determinative of a second tunable free spectral range which differs from the first free spectral range of the grid generator by an amount substantially equal to the quotient of the first free spectral range divided by one of the number of channels of the selected wavelength grid or the quotient of the first free spectral range divided by a subset of the number of channels of the selected wavelength grid.

17. The tunable laser of claim 10, wherein the combined transmissions of the channel selector and the grid generator substantially attenuate all channels except the selected channels within the selected wavelength grid.

18. The tunable laser of claim 10, wherein the grid generator and the channel selector comprise at least one of: a Fabry-Perot filter, a diffraction element, and an interference element.

19. The tunable laser of claim 10, wherein the channel selector includes at least one of: a Pockels cell, a Kerr cell, a solid etalon, a gap etalon, and a wedge-shaped etalon.

20. The tunable laser of claim 10, wherein the channel selector includes at least one of a tunable length and a tunable index of refraction.

21. The tunable laser of claim 10, wherein the tuning of the channel selector is effected by a selected one of: a mechanical actuator, a thermal actuator, an electro-optical actuator, and a pressure actuator to tune the second plurality of transmission peaks.

22. The tunable laser of claim 10, wherein the channel selector comprises:

a gas spaced etalon tunable by adjusting a pressure of a gas within the etalon to vary an optical path length thereof.

23. The tunable laser of claim 10, wherein the channel selector comprises:

an etalon responsive to an applied thermal energy to vary an optical path length thereof.

24. The tunable laser of claim 10, wherein the grid generator comprises:

an etalon; and a thermal controller to control a temperature of the etalon to maintain the substantial alignment of the first set of transmission peaks with the corresponding channels of the selected wavelength grid.

25. The tunable laser of claim 10, wherein channel tuning is effectuated by means of a lookup table in which parameters are stored for tuning to selected channels among the channels corresponding to the selected wavelength grid.

26. The tunable laser of claim 10, wherein respective free spectral ranges corresponding to the distance between the peaks in the first plurality of transmission peaks and the peaks in the second plurality of transmission peaks are selected to enable vernier tuning, whereby shifting the second plurality of transmission by a fraction of a channel spacing corresponding to the selected wavelength grid results in a switch to a channel adjacent to a current channel.

27. The tunable laser of claim 10, wherein the first plurality of transmission peaks have a first free spectrum range and the second plurality of transmission peaks have a second free spectrum range and tuning is effectuated by shifting the second plurality of transmission peaks relative to the first plurality of transmission peaks to align one of the transmission peaks from the second plurality of transmission peaks with a transmission peak from the first plurality of transmission peaks having a frequency or wavelength corresponding to a selected channel.

28. The tunable laser of claim 10, wherein the first plurality of transmission peaks have a constant free spectrum range and the second plurality of transmission peaks have a variable free spectrum range and tuning is effectuated by adjusting the variable free spectrum range of the second plurality of transmission peaks to align one of the transmission peaks from the second plurality of transmission peaks with a transmission peak from the first plurality of transmission peaks having a frequency or wavelength corresponding to a selected channel.

29. A tunable laser comprising:

a gain medium to emit an optical beam including a front facet and a rear facet defining a Fabry-Perot cavity having a first optical path length determinitive of a first plurality of transmission peaks in the optical beam substantially aligned with corresponding channels of a selected wavelength grid having a wavelength range;

a channel selector disposed adjacent to the gain medium including a tunable second optical path length determinative of a second plurality of transmission peaks with the selected wavelength grid; and a retroreflector for optically coupling the channel selector to provide feedback to the gain medium, wherein the channel selector tunes to a selected channel by tuning the second optical path length to align one of said second plurality of transmission peaks with a transmission peak in the first plurality of transmission peaks corresponding to the selected channel.

30. The tunable laser of claim 29, wherein the channel selector selects one of discrete channels throughout the wavelength grid and subsets of the channels throughout the wavelength grid.

31. The tunable laser of claim 30, wherein the subsets of the channels includes a subset of odd channels and a subset of even channels.

32. The tunable laser of claim 29, wherein channel tuning is effectuated by means of a lookup table in which parameters are stored for tuning to selected channels among the channels corresponding to the selected wavelength grid.

33. A tunable laser comprising:

a grid generator with a first optical path length determinative of a first plurality of transmission peaks substantially aligned with corresponding channels of a selected wavelength grid;

a gain medium to emit an optical beam and disposed adjacent to the grid generator, including a front facet and a rear facet defining a Fabry-Perot cavity having a tunable second optical path length determinative of a second plurality of transmission peaks tunable with respect to the first set of transmission peaks; and a retroreflector for optically coupling the grid generator to provide feedback to the gain medium to select channels to which to tune the optical beam emitted by the gain medium, wherein the tunable laser is tuned to a selected channel by tuning the second optical path length to align one of said second plurality of transmission peaks with a transmission peak in the first plurality of transmission peaks corresponding to the selected channel.

34. The tunable laser of claim 33, wherein tuning of the tunable first optical path length of the gain medium selects one of: discrete channels throughout the wavelength grid and subsets of the channels throughout the wavelength grid.

35. The tunable laser of claim 34, wherein the subsets of the channels includes a subset of odd channels and a subset of even channels.

36. A tunable laser comprising:

a gain medium to emit an optical beam along an optical path;

a grid generator etalon disposed in the optical path defining a first optical path length determinative of a first free spectral range substantially corresponding to a spacing between adjacent gridlines of a selected wavelength grid; and a channel selector etalon disposed in the optical path adjacent to the grid generator etalon and defining a second tunable optical path length determinative of a second tunable free spectral range which differs from the first free spectral range of the grid generator by an amount substantially equal to the quotient of the first free spectral range divided by one of the number of channels of the selected wavelength grid or the quotient of the first free spectral range divided by a subset of the number of channels of the selected wavelength grid.

37. The tunable laser of claim 36, wherein the channel selector etalon effects a tuning range for the second tunable optical path length substantially equal to one channel spacing within the wavelength grid thereby to tune to selected channels throughout the entire selected wavelength grid.

38. The tunable laser of claim 36, wherein the channel selector etalon selects one of:

discrete channels throughout the selected wavelength grid and subsets of the channels through the selected wavelength grid.

39. The tunable laser of claim 38, wherein the subsets of the channels includes a subset of odd channels and a subset of even channels.

* * * * *